United States Patent
Hogan et al.

(10) Patent No.: US 10,666,209 B2
(45) Date of Patent: May 26, 2020

(54) INCREASED OUTPUT IMPEDANCE SWITCHING AMPLIFIER AND LOW-SIDE RECYCLE MODE

(71) Applicant: Apple Inc., Cupertino, CA (US)

(72) Inventors: Roderick B. Hogan, San Francisco, CA (US); Troy A. Murphy, San Jose, CA (US); Nathan A. Johanningsmeier, San Jose, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 16/195,546

(22) Filed: Nov. 19, 2018

(65) Prior Publication Data

US 2020/0106406 A1 Apr. 2, 2020

Related U.S. Application Data

(60) Provisional application No. 62/737,810, filed on Sep. 27, 2018.

(51) Int. Cl.
*H03F 3/217* (2006.01)
*H03F 1/56* (2006.01)
*H04R 3/00* (2006.01)
*H03F 3/183* (2006.01)

(52) U.S. Cl.
CPC .............. *H03F 3/217* (2013.01); *H03F 1/56* (2013.01); *H03F 3/183* (2013.01); *H04R 3/00* (2013.01); *H03F 2200/03* (2013.01); *H03F 2200/33* (2013.01); *H03F 2200/387* (2013.01); *H03F 2200/471* (2013.01); *H03F 2200/481* (2013.01)

(58) Field of Classification Search
CPC .......... H03F 1/56; H03F 2200/03; H04R 3/00
See application file for complete search history.

(56) References Cited

U.S. PATENT DOCUMENTS

| | | | | |
|---|---|---|---|---|
| 7,911,273 B2* | 3/2011 | Liu | ............................ | H03F 1/26 330/207 A |
| 2007/0290750 A1* | 12/2007 | Talty | .......................... | H03F 1/32 330/251 |
| 2009/0289685 A1* | 11/2009 | Quinn | .................... | H03F 1/0211 327/333 |
| 2012/0044020 A1* | 2/2012 | Siniscalchi | ........... | H03F 3/2173 330/251 |
| 2013/0127530 A1* | 5/2013 | Ni | ............................ | H03F 3/217 330/251 |
| 2016/0065134 A1* | 3/2016 | Lu | ............................ | H03F 1/523 330/251 |

(Continued)

OTHER PUBLICATIONS

Class-D Amplifier Design Basics II, Chapter 2; International IOR Rectifier Feb. 19, 2009; 74 pages.

(Continued)

*Primary Examiner* — Regina N Holder
(74) *Attorney, Agent, or Firm* — Womble Bond Dickinson (US) LLP

(57) ABSTRACT

An audio amplifier has a first H bridge and a second H bridge, to drive a speaker as a load. The second H bridge drives the speaker through resistors for increased output impedance. Control logic operates the first H bridge as a class D amplifier for larger amplitudes of audio signal, and operates the second H bridge as a class D amplifier for smaller amplitudes of audio signal. Other aspects are also described and claimed.

19 Claims, 4 Drawing Sheets

(56) References Cited

U.S. PATENT DOCUMENTS

2017/0359037 A1\* 12/2017 Hoyerby .............. H03F 1/0277
2017/0373655 A1\* 12/2017 Mengad ................ H03F 3/393
2018/0288543 A1\* 10/2018 Shen ................... H04R 29/001

OTHER PUBLICATIONS

Application Note AN-1071, Class-D Amplifier Design Basics, byt Jun Honda & Jonathan Adams; International IOR Rectifier; 14 pages.

\* cited by examiner

INCREASED OUTPUT IMPEDANCE SWITCHING AMPLIFIER AND LOW-SIDE RECYCLE MODE

This application claims benefit of U.S. provisional patent application No. 62/737,810 filed on Sep. 27, 2018, the disclosure of which is incorporated in its entirety by reference herein.

An aspect of the disclosure here relates to class D audio amplifiers and H bridges. Other aspects are also described.

BACKGROUND

Audio systems with low noise are much sought after, as the presence of noise decreases listening enjoyment. There are many sources of noise in audio systems, including amplifier hiss, media, power supply hum, component vibration, external noise intrusion, etc. One source of noise is electromagnetic interference, which can couple at acoustic frequencies into the path between an audio amplifier output and its load, one or more speakers. This may sometimes be mitigated with the addition of adequate electromagnetic shielding, but there is an ongoing need for reduction of noise from electromagnetic coupling in audio systems.

SUMMARY

Audio amplifiers are described herein, with H bridges and modified H bridges as class D amplifiers that have increased output resistance, which helps to decrease electromagnetically coupled noise that might otherwise be heard from the speaker that is being driven by the amplifier.

In one instance, an audio amplifier has a first H bridge, a second H bridge and control logic. The first H bridge is arranged to drive a speaker as a load with an amplified version of an input audio signal. The second H bridge is also arranged to drive the speaker as a load while amplifying the audio signal, but through first and second resistors for increased output impedance (as compared to the first H bridge.) The first and second H bridges may share the same supply voltage rail. Control logic operates the first H bridge as a class D amplifier for larger amplitudes of the audio signal. The control logic operates the second H bridge as a further class D amplifier for smaller amplitudes of the audio signal.

Another aspect of the disclosure here is a method for controlling an audio amplifier. The audio amplifier has a first H bridge that is operated as a class D amplifier that is driving a speaker as a load, for larger amplitudes of an audio signal that is being amplified. A second H bridge is operated as a class D amplifier that is driving the speaker through first and second resistors, for smaller amplitudes of the audio signal. The method automatically alternates between activating the first H bridge and activating the second H bridge, responsive to changes in amplitude of the audio signal.

In yet another aspect of the disclosure, an audio amplifier has an H bridge whose first and second switches (transistor switches) are connected to a first terminal of a speaker. The H bridge has third and fourth switches connected to a second terminal of the speaker. The switches are arranged to drive the speaker as a load. A resistor has a first terminal connected to the first terminal of the speaker. Fifth and sixth switches are connected to each other and to a second terminal of the resistor. Control logic senses voltage across the speaker and operates the H bridge in a closed-loop voltage drive mode while maintaining the fifth and sixth switches open. In another mode of operation, the control logic senses voltage across the resistor and in response operates the third, fourth, fifth and sixth switches as a further H bridge in a closed-loop current drive mode. The further H bridge in closed-loop current drive mode drives the speaker through the resistor while the first and second switches are kept continuously open (by the control logic).

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

Several aspects of the disclosure here are illustrated by way of example and not by way of limitation in the figures of the accompanying drawings in which like references indicate similar elements. It should be noted that references to "an" or "one" aspect in this disclosure are not necessarily to the same aspect, and they mean at least one. Also, in the interest of conciseness and reducing the total number of figures, a given figure may be used to illustrate the features of more than one aspect of the disclosure, and not all elements in the figure may be required for a given aspect.

DETAILED DESCRIPTION

Several aspects of the disclosure with reference to the appended drawings are now explained. Whenever the shapes, relative positions and other aspects of the parts described are not explicitly defined, the scope of the invention is not limited only to the parts shown, which are meant merely for the purpose of illustration. Also, while numerous details are set forth, it is understood that some aspects of the disclosure may be practiced without these details. In other instances, well-known circuits, structures, and techniques have not been shown in detail so as not to obscure the understanding of this description.

Various H bridge-based switching amplifiers or class D amplifiers are described herein as solutions to the problem of how to reduce electromagnetically coupled noise in an audio system. In these modified H bridges, increasing the amplifier output resistance advantageously attenuates the interfering voltage (that is induced by electromagnetically coupled noise). Multiple versions of such amplifiers are presented, with various combinations of added output resistance, multiple switches, multiple legs or multiple H bridges, open-loop operation, sensing and closed-loop operation, and with considerations for improved efficiency versus output power.

Figure 1:
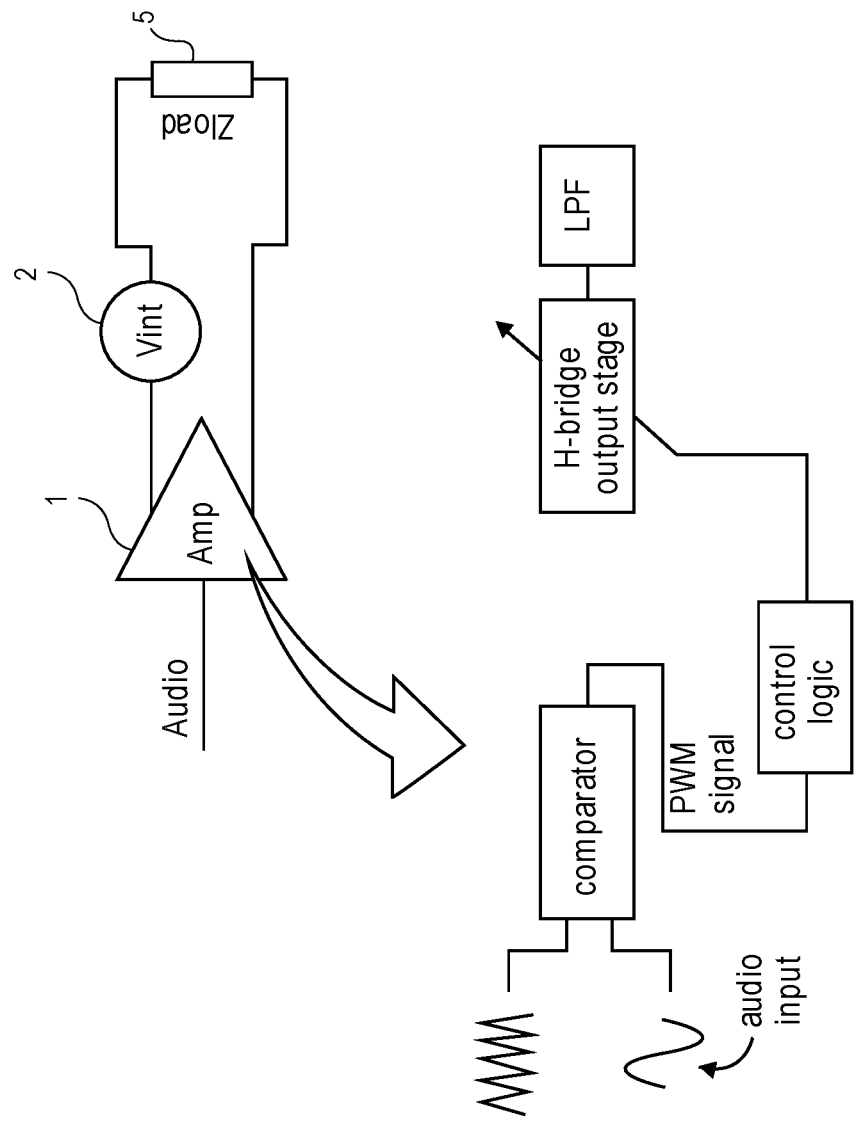
FIG. 1 depicts an interfering voltage induced between an amplifier and a transducer, such as a speaker in an audio system.

FIG. 1 depicts the concept of an interfering voltage that is induced between an amplifier 1 and its load, a transducer 5 such as a speaker in an audio system. A system problem exists particularly in headphone products whereby an interfering voltage (Vint) is induced between the amplifier 1 and its attached transducer 5 (e.g., a voice coil in a speaker driver), having an impedance Zload. Vint, represented by a voltage source 2, modulates the current that flows through the voice coil of the transducer, therefore modulating the force applied to the diaphragm of the transducer 5 and the sound produced. It should be noted that Vint could be induced in either the voice coil itself or in the electrical connections from the amplifier to the voice coil.

The load impedance Zload has a resistive component and an inductive component. If the output resistance of the amplifier 1 is close to zero, then no attenuation of the interfering voltage occurs. If the output resistance of the amplifier is increased, the interfering voltage is attenuated. For example, if the output resistance of the amplifier were to be 9 times the magnitude of the load impedance, there would be a 10-times (20 dB) attenuation of the interfering voltage. However, increasing output resistance of an amplifier decreases the overall efficiency of the amplifier, since more electrical power is dissipated in the increased output resistance of the amplifier (than is the case with a low or zero output resistance). Since power consumption is often of high importance, especially in battery powered devices such as wireless headphones, one goal of the presently described amplifiers is to increase amplifier output resistance, to attenuate electromagnetically coupled interfering voltage and thereby reduce noise heard from the speaker, while also increasing power efficiency as much as possible.

FIG. 1 also depicts a block diagram of a class D amplifier that receives an audio input signal (e.g., 20 Hz-20 kHz) and compares this input to a high frequency triangle or sawtooth waveform (e.g., having a fundamental or carrier frequency several times higher than the highest frequency component of interest in the audio input). This results in the creation of a pulse width modulation (PWM) signal that is then used by control logic (class D amplifier controller) to control a "duty cycle" of the high side and low side switches, e.g., the intervals during which the switch is closed and open, which are constituent transistor switches of an output power stage, here an H bridge, which produces an amplified digital signal. The latter is then low pass filtered (LPF) to remove the PWM carrier frequency, leaving an amplified version of the audio input driving the transducer 5. Note references in this disclosure to a transistor or switch being "closed" and "open" are equivalent to the transistor or switch being "on/turned on" and "off/turned off", respectively.

Figure 2:
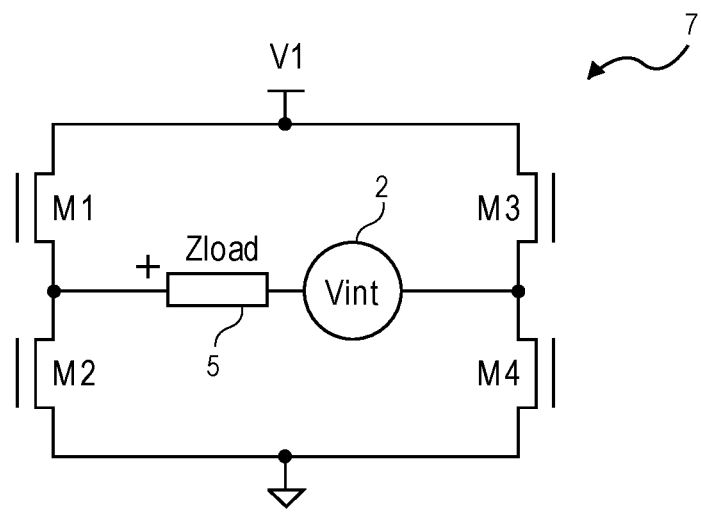
FIG. 2 is a circuit diagram of a conventional H bridge in a class D amplifier.

FIG. 2 is a circuit diagram of a conventional H bridge 7 that may be the output stage of an otherwise conventional class D amplifier (also referred to as a switching amplifier) that is amplifying an input audio signal. The H bridge 7 has high side switches M1, M3 each of which has one end connected to a common supply node V1 and another end connected to a respective output node of the audio amplifier. The transducer 5 (Zload) has its two ends connected to the respective output nodes of the audio amplifier. The H bridge 7 also has low side switches M2, M4 each of which has one end connected to a power return node (here, ground) and another end connected to the respective output node of the audio amplifier. Operation of the H bridge as a class D amplifier may be through duty cycle control of the transistor switches M1-M4 (switch on and switch off times, during each switching cycle) in accordance with the PWM signal.

Modulation of the on-off (closed-open) or duty cycles of these switches (the switching cycle period being at least several times smaller than the period of the highest audio frequency component of interest) is performed through the control logic (see FIG. 1—also referred to as a class D amplifier controller), which could be implemented using known analog and digital hardwired circuitry. Voltage across or current through the transducer 5, i.e., the speaker or load, in one direction is brought about by activating one set of diagonally opposed transistors M1 and M4, and in the other direction is brought about by activating the other set of diagonally opposed transistors M3 and M2 (in alternating fashion). In this disclosure, activating a switch or transistor means enabling the switch or transistor to respond to a PWM signal (by repeatedly opening and closing to transfer energy into the transducer 5 from the supply node V1.) Respective pulse widths or duty cycles of such activations (on-time or switch closed time vs. off-time or switch open time) determine the value of the voltage established across the load, and current through the load, and direction or polarity thereof, which will be in accordance with the audio input.

Figure 3:
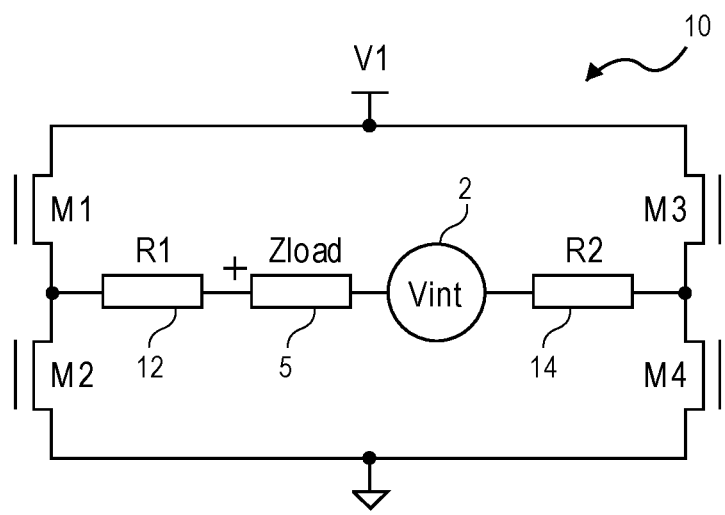
FIG. 3 is a circuit diagram of an H bridge with added output resistance, to attenuate the interfering voltage.

FIG. 3 is a circuit diagram of an H bridge 10 with added output resistance, to attenuate the interfering voltage. Resistors 12, 14 labeled R1 and R2 are added to either side of the transducer 5 (still shown with interfering voltage modeled as a voltage source 2 in series with the transducer 5). As an example, if R1 plus R2 is nine times greater than the magnitude of the load impedance, attenuation of electromagnetically coupled interfering voltage and attendant noise will be by a factor of ten (i.e., the noise will be 1/10 of what it would be without the added amplifier output resistance, for the same size output signal to the load). However, the efficiency of this configuration will be quite poor. Approximately nine times as much power will be dissipated in the resistors 12, 14 as dissipated in the transducer 5, reducing the overall efficiency of the amplifier by about the same factor of 10.

Figure 4:
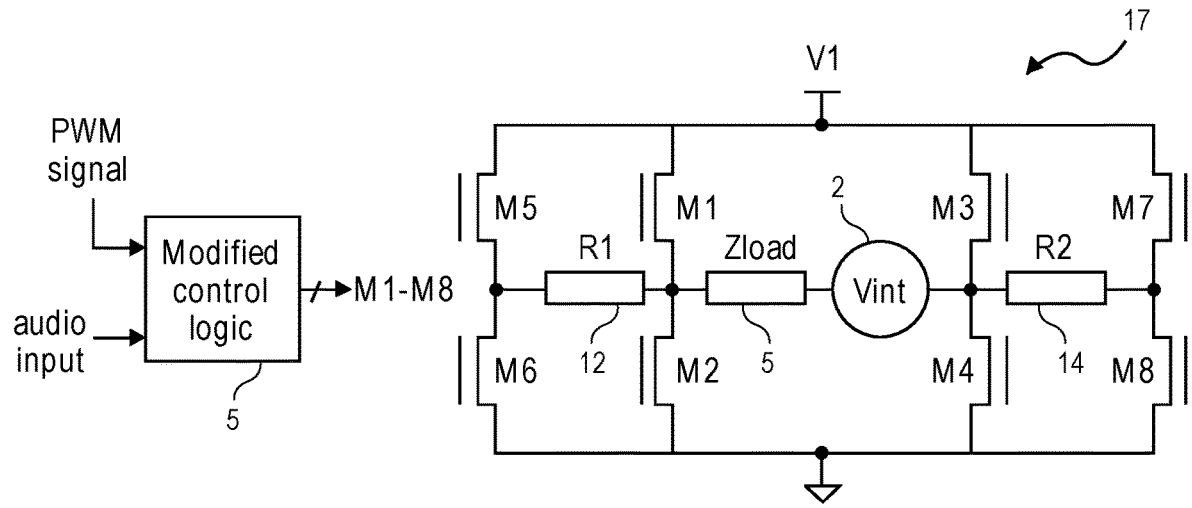
FIG. 4 is a circuit diagram of a modified H bridge with multiple operating modes, combining features shown in FIGS. 2 and 3.

FIG. 4 is a circuit diagram of a modified H bridge 17 with multiple operating modes, combining features shown in FIGS. 2 and 3 but configured to operate more efficiently. This class D amplifier is capable of operating (amplifying an input audio signal) with an output resistance of essentially 0 ohms (or nearly 0 ohms, where it is understood that there are practical limits due to the on-resistance of the transistor switches), through modulation of the transistor switches M1, M2, M3 and M4 of an inner H bridge as a voltage drive amplifier (also referred to here as a voltage source amplifier), with transistor switches M5, M6, M7 and M8 of an outer H bridge being held continuously open (transistors are turned off). This modulation and control of the duty cycle of the switching of the various transistor switches is performed by modified control logic 5, based on the PWM signal and based on the audio input or amplifier output (the audio input is shown here for convenience).

The class D amplifier is also capable of operating (amplifying the input audio signal) with an output resistance of essentially R1+R2 ohms, through modulation of the transistor switches M5, M6, M7 and M8 of the outer H bridge as a current drive amplifier (also referred to here as a current source amplifier) driving the load through the resistors 12, 14, with the transistor switches M1, M2, M3 and M4 being held open (by the modified control logic 5). And, in accordance with another aspect of the disclosure here, there may be a third mode of operation, referred to here as high resistance low-side recycle (HRLSR) mode, where M6 and M8 are conducting through a common connection to a power supply return node (e.g., ground) when neither M1 and M4 nor M2 and M3 are conducting. High resistance low-side recycle mode may be more linear and more suitable for low duty cycle operation (e.g., when the audio input has medium or intermediate amplitudes). These three modes, referred to here as voltage drive mode, current drive mode, and HRLSR mode, will now be described in more detail.

Modulation of the transistor switches of the inner H bridge is related to a conventional modulation scheme used for FIG. 2, with activation of one set of diagonally opposed transistors M1 and M4 or the other set of diagonally opposed transistors M2 and M3 (according to the PWM signal), but not both sets of diagonally opposed transistors active or on at the same time (to avoid shoot through current). Modulation of the transistor switches of the outer H bridge may also likewise be similar to conventional operation of H bridges in general, with activation of one set of diagonally opposed transistors M5 and M8, or the other set of diagonally opposed transistors M6 and M7, but not both sets of diagonally opposed transistors active or on at the same time (again, to avoid shoot through current).

In one version, modified control logic 5 operates the audio amplifier in voltage drive mode, by operating the transistor switches of the inner H bridge and simultaneously keeping the outer H bridge deactivated (all of its transistor switches are kept off or open), also referred to here as a voltage drive amplifier or voltage source amplifier, with low or essentially zero output resistance. This mode is used for larger amplitude segments of an audio signal (e.g., as sensed at the audio input or at the output of the amplifier).

Whenever smaller amplitude segments of the audio are encountered, the modified control logic 5 responds by transitioning the amplifier to current drive mode (or configures the amplifier into a current source amplifier), by operating the outer H bridge and simultaneously keeping the inner H bridge deactivated (all of its transistor switches are kept off or open), which results in larger output resistance. Such dual mode operation thus uses the higher efficiency of the inner H bridge for the larger audio segments where the induced noise is less noticeable, and uses the lower efficiency of the outer H bridge for the smaller audio segments where some loss of efficiency can be tolerated but where the suppression of the induced noise is noticeable and appreciated by the listener. The transition between these two modes occurs automatically as governed by the modified control logic 5 comparing for example the digital audio input signal to a given threshold that defines the smaller and larger audio segments, i.e., without user intervention, during audio playback.

In another aspect of the disclosure, the audio amplifier has a third mode of operation, which may be described as follows. Such an amplifier may be viewed as having two sub-modes for operating the outer H bridge in the current drive mode (or higher output impedance mode of the amplifier, meaning higher output impedance than the voltage drive mode as described above). A first sub-mode is described as being without recirculation of load current (the current drive mode described above), and a second sub-mode is with recirculation of load current. The first sub-mode (without recirculation of load current) was described above and has a first state with two switches, e.g., M5 and M8, being closed while the other two switches (e.g. M6 and M7) are open for one current direction through the load, and a second state with the two switches (M5 and M8) open and the other two switches (M6 and M7) closed for the opposed current direction. The load current in that case is not allowed to recirculate. In contrast, in the second sub-mode, there is the first state, the second state, and also a third state in which two switches (e.g., M6 and M8) are turned on simultaneously thereby allowing recirculation of load current while all other switches (of the outer H bridge but also those of the inner H bridge) are kept off. This is the third mode, also referred to as a high output resistance low side recycle (HRLSR) mode of operation.

The modified control logic 5 may be configured to sense three amplitude ranges of the audio signal during playback, namely low, medium and high, and in response its modulator 30 modulates how the transistor switches M1-M8 of FIG. 4 are operated: during low segments, the outer H bridge is operated while the transistor switches of the inner H bridge are all kept open continuously (voltage drive or low output impedance mode); during high segments, the inner H bridge is operated while the transistor switches of the outer H bridge are kept open (current drive or high output impedance mode); and during medium segments, the outer H bridge is operated in HRLSR mode where the output impedance is still deemed higher than voltage drive mode but low side recycling is allowed at times.

Figure 5:
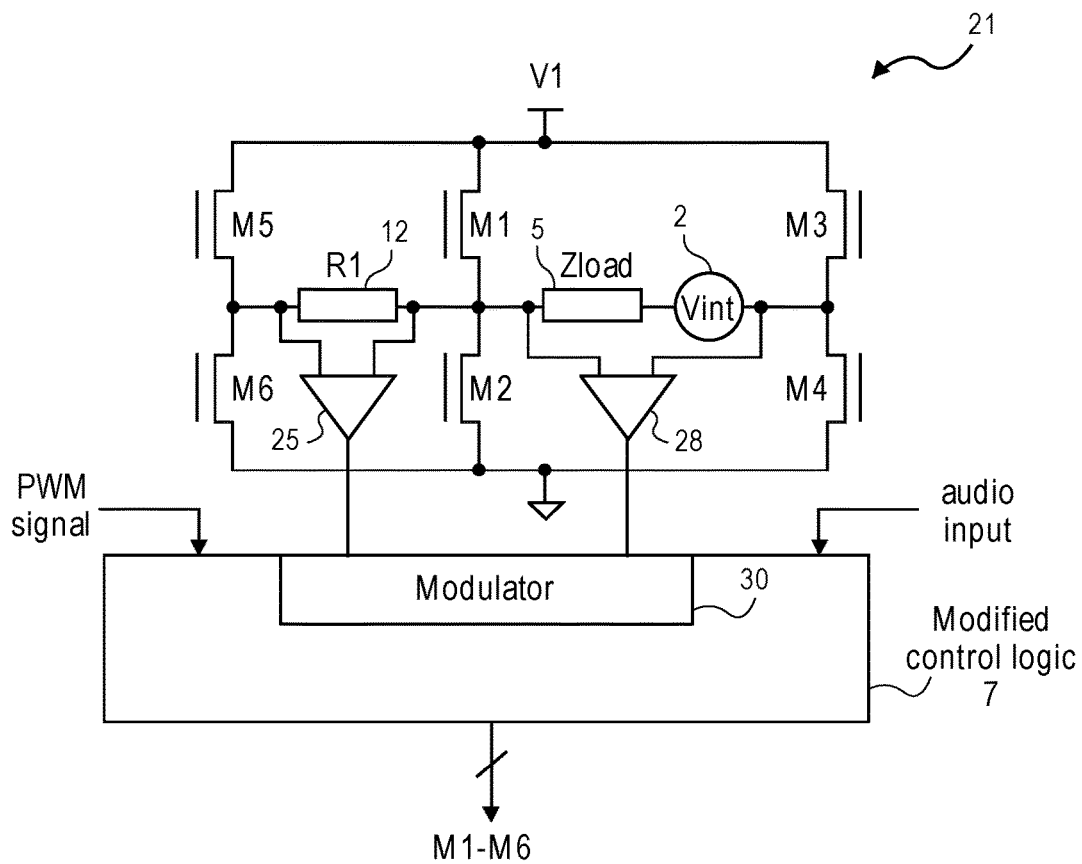
FIG. 5 is a circuit diagram of another modified H bridge, with sensing for closed-loop operation and multiple operating modes.

FIG. 5 is a circuit diagram of another modified H bridge 21, with sensing for closed-loop operation and multiple operating modes. The circuit senses voltage across the load or transducer 5 (e.g., a speaker), through one sensing amplifier 28, and voltage across a resistor 12 through another sensing amplifier 25. These sensed voltages are input to a modulator 30, which as part of modified (class D amplifier) control logic 7 modulates the switches or transistors M1-M6 of the modified H bridge 21 in two different closed-loop modes. These modes are i) voltage mode with low, zero or nearly zero output resistance, and ii) current mode with some amplifier output resistance from inclusion of the resistor 12 (coupled as shown, with one end at either the left or right output node of the "inner" H-bridge defined by M1-M4 and another end at a common output node of the M5-M6 high side low side combination. Note that in this particular example, the M5-M6 combination shares the same supply node V1 as the M1-M4 H bridge, and also the same return node, here ground, as the M1-M4 H bridge.

In some versions, the resistor 12 is a sense resistor and has a small resistance that does not contribute much to output resistance of the amplifier. In closed-loop voltage drive mode (or voltage source amplifier mode), one set of diagonally opposed transistors M1 and M4, and another set of diagonally opposed transistors M2 and M3 of the inner H bridge, are driven with the PWM signal as an inner H bridge, with transistors M5 and M6 kept off, and closed-loop operation based on sensing voltage across the load (transducer 5) which effectively includes the contribution by the interfering voltage source 2. In a closed loop current drive mode (or current source amplifier mode), one set of diagonally opposed transistors M5 and M4, and another set of diagonally opposed transistors M6 and M3, are driven with the PWM signal as another H bridge, with transistors M1 and M2 kept off, and closed-loop operation based on sensing voltage across the resistor 12 labeled R1 (and ignoring the output of the sensing amplifier 28). Since voltage is sensed across the resistor 12, an amplifier output current (current through Zload) can be readily calculated by the modulator 30, thereby sensing current through the load. As a result, the modified control logic 7 can operate the transistor switches M3-M6 for current drive in this mode. Generally in both modes, the control signals for controlling the switches should not overlap, so that both sets of diagonally opposed transistors are never on at the same time.

In one version, the modulator 30 in FIG. 5 operates the inner H bridge (M1, M2, M3 and M4) as a voltage drive amplifier with low or essentially zero output resistance responsive to detecting larger amplitude audio segments (e.g., sensed at the audio input or at the output of the amplifier) with the extra outer H bridge leg of M5 and M6 being kept deactivated (both M5 and M6 are kept open). The modified control logic 7 operates the other H bridge (M3, M4, M5 and M6) responsive to detecting smaller amplitude audio segments, while keeping the inner leg (M1 and M2) deactivated (both M1 and M2 are kept open or turned off), which effectively results in a current source amplifier—the output impedance in that case may be small (if R1 is negligible as compared to the on-resistances of the transistor switches M3-M6), or large (if R1 is several time greater than Zload). This arrangement uses i) the higher efficiency of the inner H bridge M1-M4 for amplifying the larger audio segments where the induced noise is less noticeable but has been reduced nonetheless due to closed-loop operation, and ii) the lower efficiency of the other H bridge M3-M6 for amplifying the smaller audio segments where some loss of efficiency can be tolerated but where the more accurate suppression of the induced noise is desirable. The closed-loop operation of the aspect shown in FIG. 5 acts to reduce the induced noise in both modes, but may be more accurate for the other H bridge M3-M6 due to sensing of load current through the sense resistor 12 (when amplifying the smaller audio segments). In a further variation, a sense resistor could be added to the crossbar of the inner H bridge (in series with the transducer 5) and used for sensing of load current when amplifying large amplitude audio segments.

Figure 6:
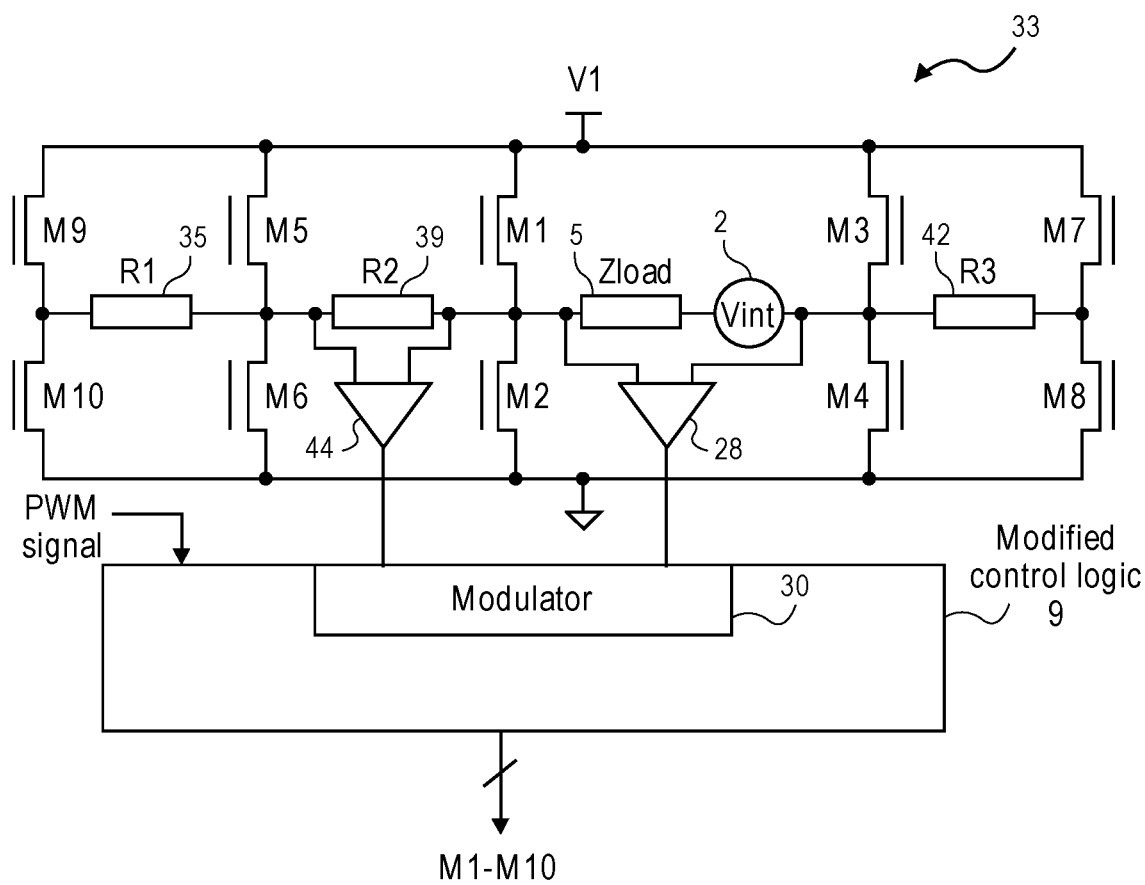
FIG. 6 is a circuit diagram of yet another modified H bridge, with sensing for closed-loop operation and multiple operating modes, combining features shown in FIGS. 2-5.

FIG. 6 is a circuit diagram of yet another modified H bridge 33, and modified control logic 9 that is sensing for closed-loop operation and supports multiple operating modes, while combining some of the features shown in FIGS. 2-5. In one version, control logic of the modulator 30 operates the inner H bridge (M1, M2, M3 and M4) as a closed-loop voltage drive amplifier (that has lower or essentially zero output resistance due to no additional resistance being present in series with the transducer 5) for larger amplitude audio segments, with the outer H bridge (M7, M8, M9, M10) and the extra inner leg (M5, M6) deactivated. In this mode, the modulator 30 is sensing voltage across the Zload through the sensing amplifier 28 and controlling M1-M4 in a closed loop operation.

For intermediate (or medium) amplitude audio segments, the modified control logic 9 operates the extra inner leg (M5 and M6) and one leg of the inner H bridge (M3 and M4) as an H bridge of a closed-loop current drive amplifier, with small or in some versions higher output resistance (due to the added resistor 39 labeled R2). This takes place while the other switches (M1, M2, M7, M8, M9 and M 10) are kept open, and while sensing across the resistor 39 labeled R2 through another sensing amplifier 44 (to achieve closed loop operation of the audio amplifier).

For small amplitude audio segments, the modified control logic 9 operates the outer H bridge (M7, M8, M9 and M10) as an open loop current drive amplifier with higher output resistance (due to the added resistors 35, 39, 42 labeled R1, R2 and R3), while the inner H bridge (M1, M2, M3 and M4) and the extra inner leg (M5, M6) are kept open.

In the version of the audio amplifier shown in FIG. 6, several high resistance low-side recycle HRLSR modes are also available. E.g., M6 and M8 are both kept turned on, to enable the current through Zload to recycle through those low side switches M6, M8 while all other switches are kept off, or alternatively M8 and M 10 are kept turned on while all other switches are kept off, or alternatively M6 and M4 are kept on while all other switched are kept off, or lastly M 10 and M4 are kept on while all other switches are kept off. Any one or more of these HRLSR modes can be combined with one, some, or all of the above modes, in different variations of an audio amplifier that is in accordance with FIG. 6.

With reference to FIGS. 4-6, further variations are possible. In one version, the modified control logic 5, 7 or 9 controls a ratio of activity time of one H bridge to the activity time of another H bridge, or a ratio of activity time of one H bridge to the activity time of another leg of an H bridge, in order to control (e.g., adjust or vary, maintain or regulate) the output impedance of the audio amplifier. In other versions, a ratio of activity time of an H bridge to the on-time of recirculation of load current (during HRLSR mode), is controlled in order to control the output impedance of the audio amplifier. The modified control logic 5, 7, or 9 can blend between voltage drive mode and current drive mode, when transitioning between smaller amplitudes and larger amplitudes of the audio signal, through appropriate activation of the transistor switches of the various bridges or legs of bridges. Changing between activating one or another of the H bridges could be abrupt or it could gradual or blended over time (e.g., to avoid an audible "pop" artifact from the transducer 5), based on the changes in amplitude of the audio signal.

The modified control logic 5, 7 or could pre-calculate a duty cycle schedule for the transistor switches of one or more of the H bridges, in order to operate an H bridge in an open loop configuration (in accordance with the PWM signal). For example there could be tables for timing, with values looked up, or calculation of duty cycle could be based on digital signal processing of the audio signal. Alternatively, the modified control logic 5, 7, or 9 could operate the transistor switches (adjust their duty cycles) in accordance with a closed-loop configuration with error correction over time, based on measuring the amplifier output voltage (voltage across Zload), e.g., based on comparison of the measured amplifier output versus the audio input signal.

While certain aspects have been described and shown in the accompanying drawings, it is to be understood that such are merely illustrative of and not restrictive on the broad invention, and that the invention is not limited to the specific constructions and arrangements shown and described, since various other modifications may occur to those of ordinary skill in the art. For example, while FIGS. 2-6 depicts circuits with MOSFETs, it is also possible to have NMOS, PMOS, CMOS, bipolar, or other transistors and combinations of types of transistors, as switches, and other types of switches. The description is thus to be regarded as illustrative instead of limiting. Also, to aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An audio amplifier for amplifying an audio signal, the audio amplifier comprising:
   a first H bridge arranged to drive a speaker as a load;
   a second H bridge arranged to drive the speaker, wherein the second H bridge drives the speaker through first and second resistors that directly increase an output impedance of the audio amplifier when the second H bridge is driving the speaker, as compared to the output impedance when the first H bridge is driving the speaker; and control logic to operate the first H bridge as a class D amplifier for larger amplitudes of the audio signal, and operate the second H bridge as a further class D amplifier for smaller amplitudes of the audio signal.

2. The audio amplifier of claim 1, further comprising:
the control logic to close a first switch of the second H bridge, coupled through the first resistor to the speaker, and a second switch of the second H bridge, coupled through the second resistor to the speaker, to recirculate load current of the speaker through a common connection of the first and second switches while all switches of the first H bridge are off.

3. The audio amplifier of claim 1, further comprising:
the control logic to open all switches of the first H bridge and activate switches of the second H bridge; and
the control logic to open all switches of the second H bridge and activate switches of the first H bridge.

4. The audio amplifier of claim 1, further comprising:
the control logic to control a ratio of a first activity time of the first H bridge to a second activity time of the second H bridge, to control output impedance of the audio amplifier.

5. The audio amplifier of claim 1, further comprising:
the control logic to activate switches of the first H bridge for a lower output impedance, voltage mode drive to the speaker, for the larger amplitudes of the audio signal;
the control logic to activate switches of the second H bridge for a higher output impedance, current mode drive to the speaker, for the smaller amplitudes of the audio signal; and
the control logic to activate the switches of the first and second H bridges to blend between the voltage mode drive and the current mode drive when transitioning between the smaller amplitudes of the audio signal and the larger amplitudes of the audio signal.

6. The audio amplifier of claim 1, further comprising:
the control logic to close two low side switches of the second H bridge, to recirculate load current while two high side switches of the second H bridge are open.

7. The audio amplifier of claim 1, further comprising:
the control logic to operate the second H bridge in a first mode having a first state with two switches closed and a further two switches open for a first current direction, and a second state with the two switches open and the further two switches closed for an opposed second current direction; and
the control logic to operate the second H bridge in a second mode having the first state, the second state, and a third state in which two low side switches are closed to recirculate load current while two high side switches of the second H bridge are open.

8. The audio amplifier of claim 1, further comprising:
the control logic to operate the first or second H bridge in an open loop, by pre-calculating duty cycle for switches of the first or second H bridge.

9. The audio amplifier of claim 1, further comprising:
the control logic to operate the first or the second H bridge in a closed loop, by measuring an output and adjusting duty cycle for switches of the first or second H bridge.

10. The audio amplifier of claim 1, further comprising:
a sense resistor coupled to the speaker and to the first resistor;

two switches coupled to the sense resistor and to the first resistor;
a first amplifier coupled to the sense resistor to measure voltage across the sense resistor;
a second amplifier coupled to the speaker to measure voltage across the speaker; and
the control logic being configured to operate the first and second H bridges in closed loop responsive to outputs of the first and second amplifiers.

11. A method of controlling an audio amplifier, comprising:
operating, a first H bridge as a class D amplifier that is driving a speaker as a load, for larger amplitudes of an audio signal;
operating a second H bridge as a class D amplifier that is driving the speaker through first and second resistors, for smaller amplitudes of the audio signal;
changing between activating the first H bridge and activating the second H bridge responsive to changes in amplitude of the audio signal; and
varying a ratio of a first activity time of the first H bridge to a second activity time of the second H bridge, to control output impedance of the audio amplifier.

12. The method of claim 11, further comprising:
opening all switches of the first H bridge;
activating switches of the second H bridge;
opening all switches of the second H bridge; and
activating the switches of the first H bridge.

13. The method of claim 11, wherein:
the operating the first H bridge comprises activating switches of the first H bridge for a lower output impedance, voltage mode drive to the speaker, for the larger amplitudes of the audio signal;
the operating the second H bridge comprises activating switches of the second H bridge for a higher output impedance, current mode drive to the speaker, for the smaller amplitudes of the audio signal; and
the changing comprises activating the switches of the first and second H bridges to blend between the voltage mode drive and the current mode drive for an intermediate output impedance when transitioning between the smaller amplitudes of the audio signal and the larger amplitudes of the audio signal and vice versa.

14. The method of claim 11, further comprising:
opening all switches of the first H bridge;
opening two upper, power supply-connected switches of the second H bridge; and
closing two low side switches of the second H bridge, to recirculate load current.

15. The method of claim 11, further comprising:
operating the second H bridge in two states of a first mode comprising a first state having two switches closed while a further two switches are open, for a first current direction, and a second state having the two switches open and the further two switches closed for an opposed second current direction; and
operating the second H bridge in three states of a second mode comprising the first state, the second state, and a third state having two high side switches open and two low side switches closed to recirculate load current.

16. The method of claim 11, further comprising:
pre-calculating duty cycle for switches of the first or second H bridge, to operate the first or second H bridge in an open loop.

17. The method of claim 11, further comprising:
measuring an output of the first or second H bridge; and adjusting duty cycle for switches of the first or second H bridge, based on the measuring, to operate the first or the second H bridge in a closed loop.

18. The method of claim 11, further comprising:

measuring voltage across a sense resistor coupled to the speaker;

measuring voltage across the speaker, including electromagnetically induced noise voltage; and operating the first and second H bridges in a closed loop, based on the measuring the voltage across the sense resistor and the measuring the voltage across the speaker.

19. An audio amplifier for amplifying an audio signal, the audio amplifier comprising:

an H bridge having first and second switches to be connected to a first terminal of a speaker and third and fourth switches to be connected to a second terminal of the speaker, arranged to drive the speaker as a load;

a resistor having a first terminal connected to the first terminal of the speaker;

fifth and sixth switches connected to each other and to a second terminal of the resistor; and control logic to sense voltage across the speaker and operate the H bridge in a closed-loop voltage drive mode with the fifth and sixth switches kept open, and to sense voltage across the resistor and operate the third, fourth, fifth and sixth switches as a further H bridge in a closed-loop current drive mode driving the speaker through the resistor with the first and second switches kept open.

* * * * *